United States Patent
Tanabe et al.

(10) Patent No.: US 11,061,324 B2
(45) Date of Patent: Jul. 13, 2021

(54) MANUFACTURING METHOD OF REPLICA TEMPLATE, MANUFACTURING METHOD OF SEMICONDUCTOR DEVICE, AND MASTER TEMPLATE

(71) Applicant: TOSHIBA MEMORY CORPORATION, Tokyo (JP)

(72) Inventors: Mana Tanabe, Yokohama Kanagawa (JP); Shingo Kanamitsu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 148 days.

(21) Appl. No.: 16/107,982

(22) Filed: Aug. 21, 2018

(65) Prior Publication Data

US 2019/0278167 A1 Sep. 12, 2019

(30) Foreign Application Priority Data

Mar. 9, 2018 (JP) .............................. JP2018-043209

(51) Int. Cl.
*H01L 21/308* (2006.01)
*H01L 21/467* (2006.01)
*H01L 21/311* (2006.01)
*G03F 7/00* (2006.01)
*H01L 21/033* (2006.01)

(52) U.S. Cl.
CPC ........ *G03F 7/0002* (2013.01); *H01L 21/0337* (2013.01); *H01L 21/3086* (2013.01); *H01L 21/31144* (2013.01)

(58) Field of Classification Search
CPC . H01L 21/308; H01L 21/467; H01L 21/31144
See application file for complete search history.

(56) References Cited

U.S. PATENT DOCUMENTS

| | | | |
|---|---|---|---|
| 6,074,946 A * | 6/2000 | Ouellet ............. | H01L 21/31144 216/41 |
| 2007/0068898 A1* | 3/2007 | Lorenz ....................... | B41J 2/01 216/27 |
| 2007/0262049 A1 | 11/2007 | Miyajima et al. | |
| 2010/0264113 A1* | 10/2010 | Yoneda .................. | B82Y 40/00 216/41 |
| 2017/0235221 A1* | 8/2017 | Nagai ................... | B29C 59/026 264/40.1 |

FOREIGN PATENT DOCUMENTS

| | | |
|---|---|---|
| JP | 2013-193454 A | 9/2013 |
| JP | 5942551 B2 | 6/2016 |

* cited by examiner

*Primary Examiner* — Thomas T Pham
(74) *Attorney, Agent, or Firm* — Kim & Stewart LLP

(57) ABSTRACT

A method of manufacturing a replica template includes preparing a substrate including a first protruding portion protruding from a first surface of the substrate and having a patterning surface thereon, forming a first mask pattern over the patterning surface, the first mask pattern comprising a convex portion having a smaller width than the patterning surface and a pattern disposed on the convex portion, removing a portion of the first protruding portion using the first mask pattern as a mask to produce a second protruding portion on the first protruding portion, and forming a pattern in the patterning surface on the second protruding portion by transferring the shape of the pattern of the first mask pattern into the patterning surface on the second protruding portion.

14 Claims, 8 Drawing Sheets

US 11,061,324 B2

MANUFACTURING METHOD OF REPLICA TEMPLATE, MANUFACTURING METHOD OF SEMICONDUCTOR DEVICE, AND MASTER TEMPLATE

CROSS-REFERENCE TO RELATED APPLICATIONS

This application is based upon and claims the benefit of priority from. Japanese Patent Application No. 2018-043209, filed Mar. 9, 2018, the entire contents of which are incorporated herein by reference.

FIELD

Embodiments described herein relate generally to a manufacturing method of a replica template, a manufacturing method of a semiconductor device, and a master template.

BACKGROUND

As a method for forming a fine pattern in a manufacturing process of a semiconductor device, an imprinting method is proposed. In the imprinting method, a resist is coated on a film to be processed, a template on which a fine pattern is formed is pressed on or into the resist, and the resist is filled into a recessed portion of the template, and then the resist is cured by irradiating it with ultraviolet rays. The fine pattern of the template transferred onto the resist in this manner is formed on a mesa portion protruding from a template main surface.

DETAILED DESCRIPTION

In manufacturing the template as described above, it is necessary to form a fine pattern and a mesa portion separately by using a plurality of different templates. At this time, as described above, those used for manufacturing a semiconductor device may be referred to as a replica template, and those used for manufacturing the replica template may be referred to as a master template.

Embodiments described herein provide a manufacturing method of the replica template, a manufacturing method of a semiconductor device, and a master template capable of collectively forming the fine pattern and the mesa portion.

In general, according to one embodiment, a method of manufacturing a replica template includes preparing a substrate including a first protruding portion protruding from a first surface of the substrate and having a patterning surface thereon, forming a first mask pattern over the patterning surface, the first mask pattern comprising a convex portion having a smaller width than the patterning surface and a pattern disposed on the convex portion, removing a portion of the first protruding portion using the first mask pattern as a mask to produce a second protruding portion on the first protruding portion, and forming a pattern in the patterning surface on the second protruding portion by transferring the shape of the pattern of the first mask pattern into the patterning surface on the second protruding portion.

Hereinafter, embodiments will be described in detail with reference to the drawings. It should be noted that the present disclosure is not limited to the following embodiments. In addition, constituent elements in the following embodiments include those that can be easily assumed by those skilled in the art or those that are substantially the same.

By using FIG. 1 to FIG. 8H, the present embodiment will be described.

Configuration Example of Template

Figure 1:
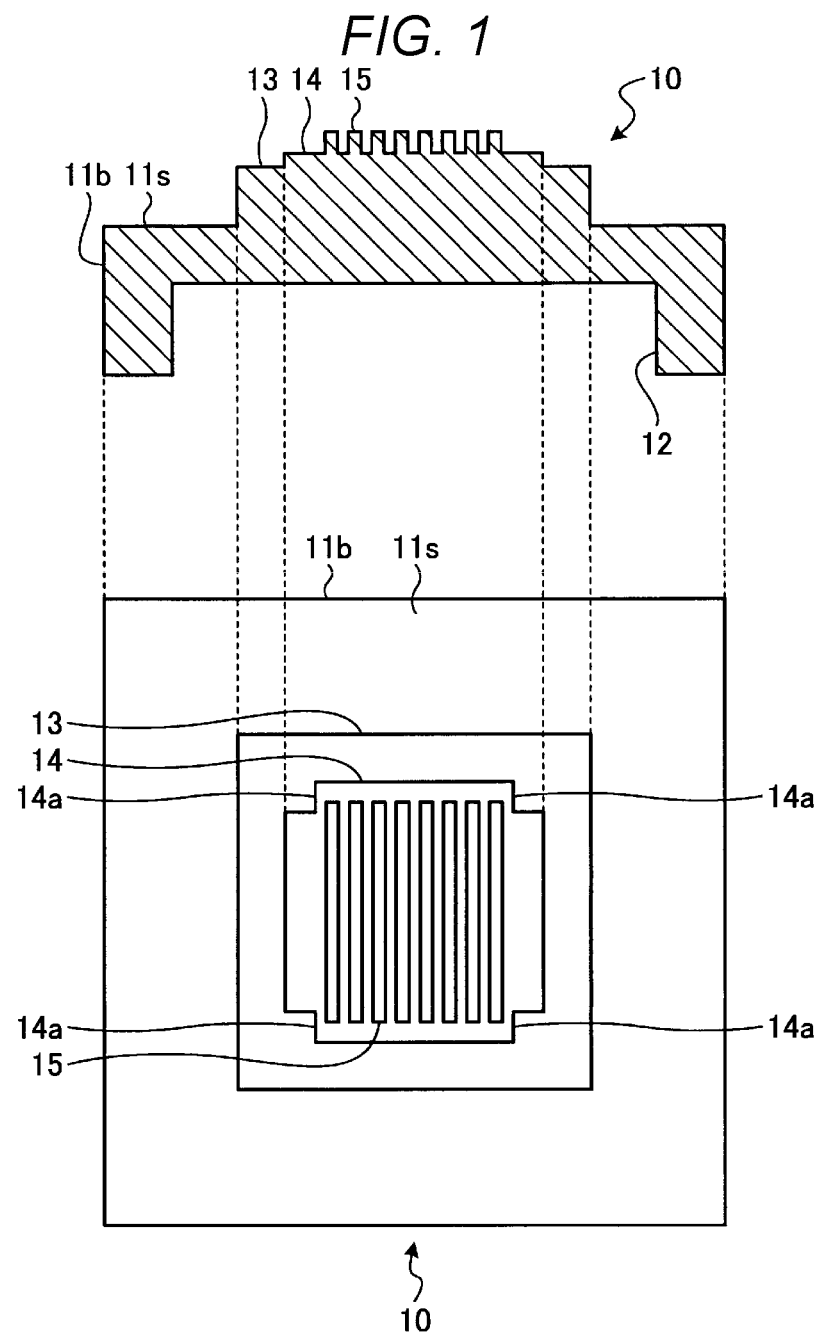
FIG. 1 is a diagram illustrating a configuration example of a replica template according to an embodiment.

FIG. 1 is a diagram illustrating a configuration example of a replica template 10 according to an embodiment. An upper portion of FIG. 1 is a cross-sectional view of the replica template 10, and a lower portion is a plan view of the replica template 10.

As shown in FIG. 1, the replica template 10 of the embodiment includes the mesa portion 13 on a main surface 11s as a first mesa portion, the mesa portion 14 on the mesa portion 13 as the second mesa portion, and fine patterns 15 on the mesa portion 14.

More specifically, the replica template 10 is configured of a transparent member such as crystal or glass. In addition, the replica template 10 includes a body 11b. The body 11b has a substantially square shape in a top plan view. On the rear surface of the body 11b, a counterbore 12 is provided.

The mesa portion 13 is formed on the main surface 11s of the body 11b. For example, the mesa portion 13 is disposed on a center portion of the main surface 11s of the body 11b, and has a substantially square shape in a top plan view. For example, the step height of the mesa portion 13 above the main surface 11s is approximately several tens of μm. The mesa portion 13 is formed with a large positional tolerance processing accuracy.

On the mesa portion 13, the mesa portion 14 having a region smaller than that of the mesa portion 13 is formed. For example, the mesa portion 14 is disposed on a center portion of the mesa portion 13, and has a substantially square shape in which cutout portions 14a are provided at four corners in top plan view. However, the shape of the mesa portion 14 is not limited thereto, and may be, for example, a square shape and a rectangular shape without a cutout portion. Such a shape of the mesa portion 14 is determined such that a shot region is a desired shape. The shot region is a region of a resist to be patterned by one imprint process (one imprinting by replica template 10). For example, the step height of the mesa portion 14 above mesa portion 13 is approximately less than a micron to 1 μm. As will be described below, the mesa portion 14 is formed with precise, i.e., fine tolerance, processing accuracy by using, for example, a nanoimprint technology.

On the mesa portion 14, for example, the fine patterns 15 of a nano order size are formed. For example, the fine pattern 15 includes a line/space (L/S) pattern in which a convex portion and a recess portion (groove) are arranged. However, the pattern of the fine pattern 15 is not limited thereto, and may be a pattern in which dot shape protrusions, i.e., circular or round in section columns, are arranged in a matrix pattern, or another pattern. The fine pattern 15 of the replica template 10 is an inverted or reversed pattern to that transferred to the resist on the substrate using the template.

In this manner, by disposing the fine pattern 15 on the mesa portion 13 and the mesa portion 14, even when the replica template 10 is tilted at the time of imprinting on the resist on the semiconductor substrate, it is possible to prevent the body 11b from contacting the semiconductor substrate.

Figure 2:
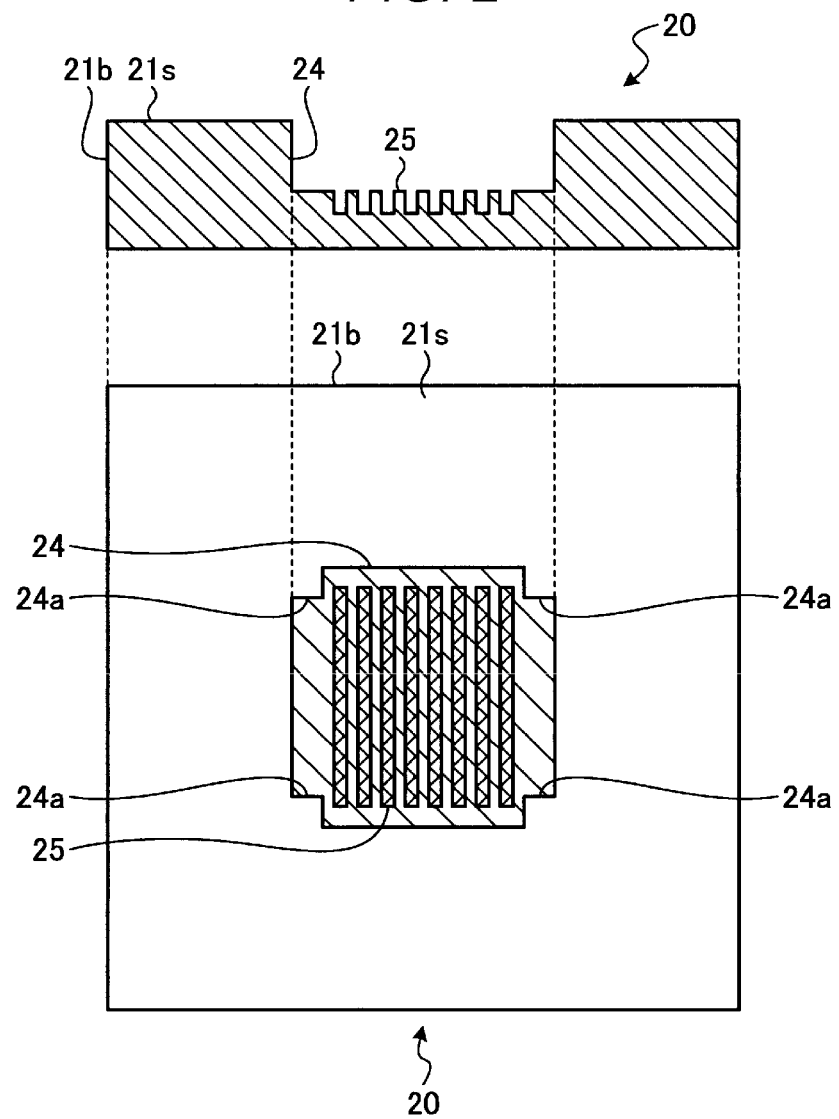
FIG. 2 is a diagram illustrating a configuration example of a master template according to the embodiment.

Next, referring to FIG. 2, a configuration of a master template 20 for manufacturing of the replica template 10 will be described. FIG. 2 is a diagram illustrating a configuration example according to the embodiment the master template 20. The upper portion of FIG. 2 is a sectional view of the master template 20, and the lower portion is a plan view of the master template 20.

As shown in FIG. 2, the master template 20 of the embodiment includes the recess portion 24 and a fine pattern 25 extending further in a depth direction from the bottom or base of the recess portion 24.

More specifically, the master template 20 is configured of a transparent member such as crystal and glass. In addition, the master template 20 includes a body 21b. The body 21b has an approximately square shape with one side of approximately 152 mm in top plan view. The recess portion 24 is recessed from a main surface 21s of the body 21b. For example, the recess portion 24 is disposed on a center portion of the main surface 21s of the body 21b, and has an approximately square shape in which the protrusions 24a are provided at four corners in top view. The width of the recess portion 24 (maximum width when there is no protrusion 24a) is, for example, 20 mm or more and 40 mm or less. A length of one side of the protrusion 24a is, for example, several μm to several mm. However, the shape of the recess portion 24 is not limited thereto, and it may be a square shape, a rectangular shape, or the like not including, for example, the protrusions. The depth of the recess portion 24 is, for example, approximately several tens nm to several μm.

The fine pattern 25 is further recessed from the bottom or base of the recess portion 24. For example, the fine pattern 25 includes an L/S (line/space) pattern in which the convex portion and the recess portion (groove) are arranged. The relationship between the width of the convex portion and the width of the recess portion is, for example, 1:1, and each portion has a width of 10 nm or more and 30 nm or less. However, the pattern of the fine pattern 25 is not limited thereto, and may be a pattern in which holes of nano order size are arranged in a matrix or another pattern. The fine pattern 25 of the master template 20 is an inverse or reverse pattern to that of the fine pattern 15 of the replica template 10, so as to be transferred inversely or in reverse to the replica template 10.

Manufacturing Process of Replica Template

Next, with reference to FIGS. 3A to 3G, an example of a manufacturing process of the replica template 10 will be described. FIGS. 3A to 3G are flow diagrams illustrating an example of a procedure of the manufacturing process of the replica template 10 according to the embodiment.

Figure 3A:
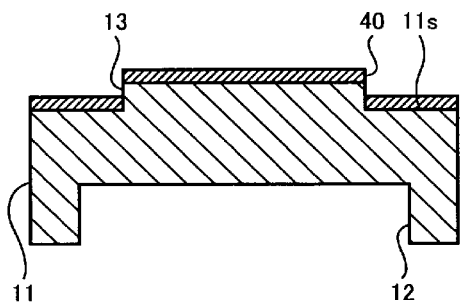
FIGS. 3A to 3G are flow diagrams illustrating an example of a procedure of a manufacturing process of the replica template according to the embodiment.

As shown in FIG. 3A, first, a substrate 11 including the mesa portion 13 protruding from the main surface 11s and having a patterning surface thereon, to become the replica template 10 by processing of the patterning surface, is prepared.

The substrate 11 is a configured of a material such as crystal or glass. The counterbore 12 is provided on a front surface side of the substrate 11. In addition, the mesa portion 13 is formed on the main surface 11s of the substrate 11. In addition, an inorganic hardmask film such as a Cr film 40 is formed on the main surface 11s and the mesa portion 13. However, the inorganic mask film may not be a Cr material. A material which is difficult to etch a resin type mask pattern which will be described below when etching the inorganic mask film and which is difficult to etch the inorganic type mask film when etching the substrate 11 can be selected as the inorganic type mask film.

Figure 3E:
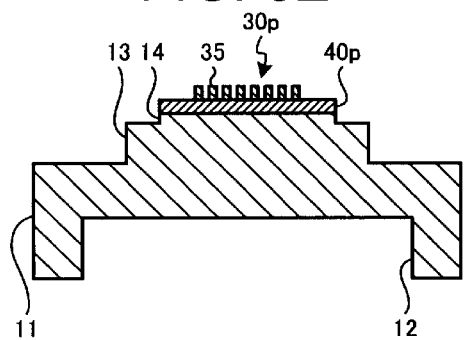
Figure 3B:
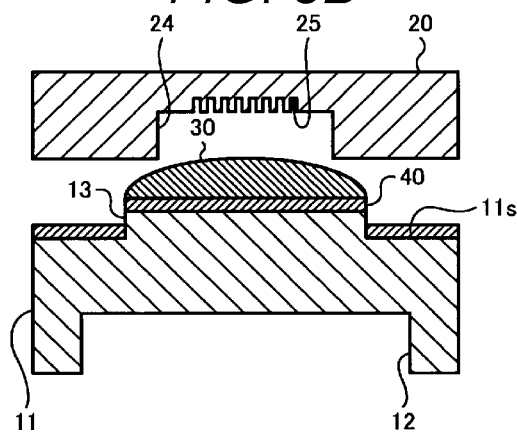
Figure 3F:
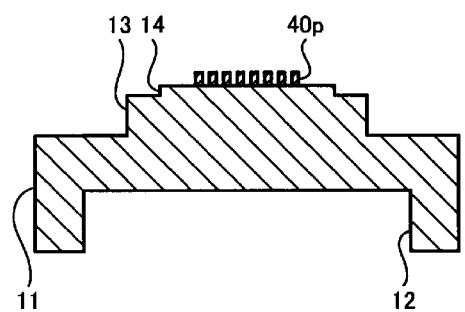
Figure 3C:
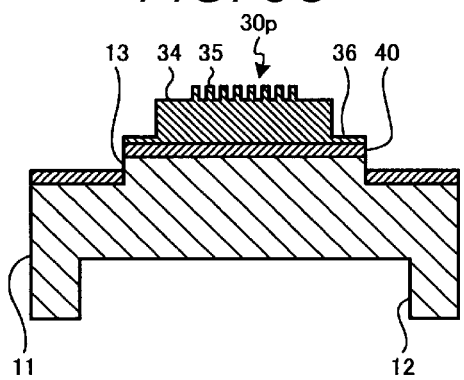

Next, as shown in FIGS. 3B and 3C, a resist pattern 30p as the resin type mask pattern, including the convex portion 34 having a region smaller than that of the mesa portion 13 in the top view and a fine pattern 35 disposed on the convex portion 34 is formed on the mesa portion 13 of the substrate 11.

That is, as shown in FIG. 3B, the resist 30 is dropped onto the mesa portion 13 of the substrate 11. For example, the resist 30 is a photo-curable resist. Thereafter, the master template 20 is used to imprint the resist 30. At this time, the resist 30 and surfaces of the recess portion 24 of the master template 20 and a fine pattern 25 side are arranged to face each other. In a state in which the master template 20 pattern is imprinted on the resist 30, the resist 30 is irradiated with light by transmitting the master template 20 from above, and the resist 30 is cured. Then, the master template 20 is released.

With this, as shown in FIG. 3C, the resist pattern 30p including the convex portion 34 and the fine pattern 35 is formed. In addition, the resist pattern 30p includes a residual resist film 36 in a gap generated between the master template 20 and the substrate 11.

Figure 3G:
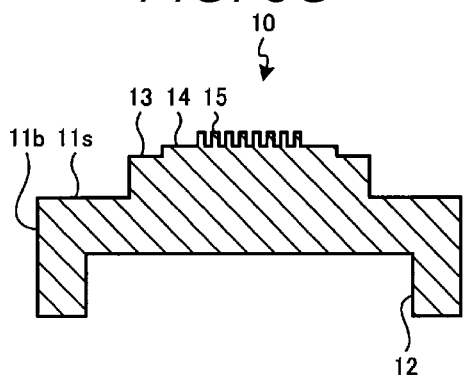
Figure 3D:
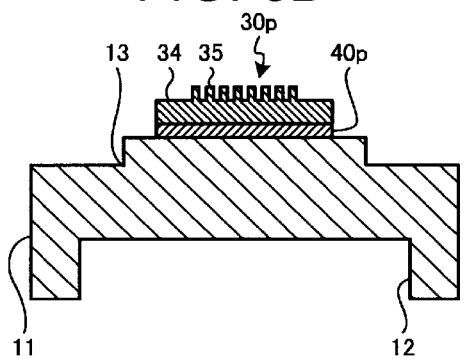

Next, as shown in FIGS. 3D and 3E, a shape of the convex portion 34 of the resist pattern 30p is transferred to the Cr pattern 40 on the template substrate 11, and the mesa portion 14 having a region smaller than that of the mesa portion 13 in the top view is formed on the mesa portion 13.

More specifically, the Cr pattern 40p as an inorganic mask pattern is formed by transferring the pattern shape of the convex portion 34 of the resist pattern 30p to the Cr film 40 with the Cr pattern 40p to which the shape of the convex portion 34 is transferred as a mask.

That is, as shown in FIG. 3D, the resist pattern 30p is etched by using N2 gas or the like. With this, by reducing a remaining film of the entity of the resist pattern 30p, the residual resist film 36 is removed. In addition, the Cr film 40 is etched by using plasma such as $Cl_2$ gas. With this, the Cr film 40 exposed, i.e., not covered by, the resist pattern 30p and the Cr film 40 exposed after the disappearance of the residual resist film 36 is etched away and the Cr pattern 40p to which the convex portion 34 of the resist pattern 30p is transferred is formed.

In addition, as shown in FIG. 3E, the substrate 11 is etched by using plasma such as F gas using the resist and the Cr pattern 40p as a mask. With this, a peripheral part of the mesa portion 13 of the substrate 11 is removed, and the mesa portion 14 is formed on the mesa portion 13. In addition, the remaining film of the entity of the resist pattern 30p is further reduced, and only the fine pattern 35 remains.

Next, as shown in FIGS. 3F and 3G, a shape of the fine pattern 35 of the resist pattern 30p is transferred to the substrate 11 to form the fine pattern 15 on the mesa portion 14.

More specifically, the shape of the fine pattern 35 of the resist pattern 30p is transferred to the Cr pattern 40p, and the fine pattern 35 is transferred into the Cr pattern 40p in which the mask has the shape of the fine pattern 35.

That is, as shown in FIG. 3F, the Cr pattern 40p is further etched by using plasma such as $Cl_2$ gas with the resist pattern 30p formed by only the fine pattern 35 as a mask. With this, the Cr pattern 40p exposed by the openings in the resist pattern 30p is removed, and the Cr pattern 40p into which the fine pattern 35 of the resist pattern 30p is transferred is formed. At this time, the resist pattern 30p has been fully removed.

In addition, as shown in FIG. 3G, the substrate 11 is etched using the Cr pattern 40p as a mask by using plasma such as F gas or the like. With this, the parts of the mesa portion 14 of the substrate 11 exposed in the openings in the resist pattern is recessed, and thus the fine pattern 15 is formed on the mesa portion 14. At this time, the Cr pattern 40p is removed.

As described above, the replica template 10 of the embodiment is manufactured.

Manufacturing Process of Semiconductor Device

Figure 4:
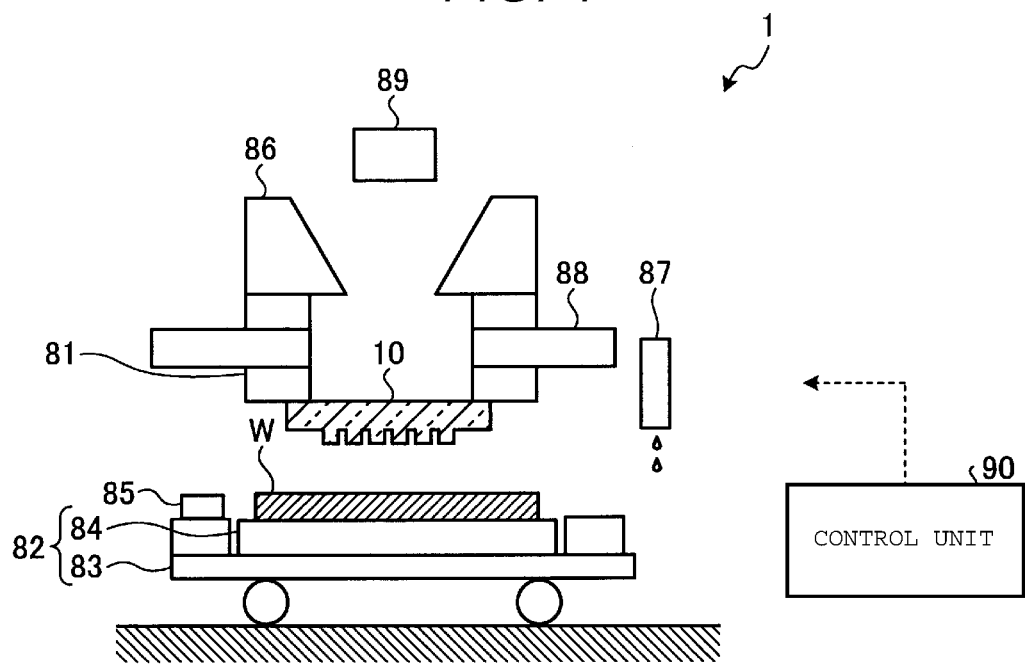
FIG. 4 is a diagram illustrating a configuration example of an imprint device.

Next, as a use example of the replica template 10 of the embodiment, an example of the manufacturing process of the semiconductor device will be described. The replica template 10 is installed in an imprint device, and used for a manufacturing process of a semiconductor device. First, referring to FIG. 4, a configuration example of an imprint device 1 will be described. FIG. 4 is a diagram illustrating a configuration example of the imprint device 1.

As shown in FIG. 4, the imprint device 1 includes a template stage 81, a mounting table 82, a reference mark 85, an alignment sensor 86, a liquid dropping device 87, a stage base 88, a light source 89, and a control unit 90. The replica template 10 is installed in the imprint device 1.

The mounting table 82 includes a wafer chuck 84 and a main body 83. The wafer chuck 84 fixes a wafer W as the semiconductor substrate at a predetermined position on the main body 83. The reference mark 85 is provided on the mounting table 82. The reference mark 85 is used for positioning when loading the wafer W on the mounting table 82.

The wafer W is placed on the mounting table 82, and the mounting table 82 moves in a plane (a horizontal plane) parallel to the placed wafer W. The mounting table 82 moves the wafer W below the downwardly facing side of the liquid dropping device 87 when dropping the resist on the wafer W, and moves the wafer W to a location below the replica template 10 when performing a pattern transfer process into the resist on the wafer W.

The stage base 88 supports the replica template 10 by the template stage 81 and moves it in an up-and-down direction (vertical direction) such that the stage base 88 presses the fine pattern 15 of the replica template 10 against the resist on the wafer W. The alignment sensor 86 is provided on the stage base 88. The alignment sensor 86 is a sensor for performing position detection of the wafer W and position detection of the replica template 10.

The liquid dropping device 87 is a device for dropping the resist on the wafer W by an inkjet method. An ink jet head mounted on the liquid dropping device 87 includes a plurality of fine holes for ejecting droplets, and drops droplets of the resist on the wafer W.

For example, the light source 89 is a device for emitting ultraviolet rays, and is provided above the stage base 88. The light source 89 emits light from above of the replica template 10 to irradiate the resist in a state where the replica template 10 is pressed against the resist.

The control unit 90 controls the template stage 81, the mounting table 82, the reference mark 85, the alignment sensor 86, the liquid dropping device 87, the stage base 88, and the light source 89.

FIGS. 5A to 5E are diagrams illustrating an example of a procedure of the manufacturing process of the semiconductor device according to the embodiment.

The above-described manufacturing process of the replica template 10 is included in the manufacturing process of the semiconductor device of the embodiment. In FIGS. 5A to 5E, a process for processing a film to be processed of the wafer W is illustrated after manufacturing the replica template 10.

Figure 5A:
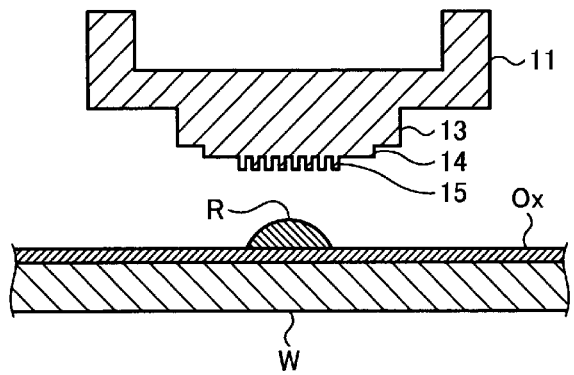
FIGS. 5A to 5E are diagrams illustrating an example of a procedure of a manufacturing process of a semiconductor device according to the embodiment.

As shown in FIG. 5A, the film to be processed Ox is formed on the wafer W, a resist R as a resin type mask material drops on the film to be processed Ox. The imprint device 1 of the embodiment is configured to drop the resist R, but the resist may be coated on the whole surface of the wafer W by a spin coat application method.

That is, the wafer W on which the film to be processed Ox is formed is located on the mounting table 82. Therefore, the mounting table 82 is moved to a to be processed location of the film to be processed Ox below the liquid dropping device 87, such that the droplets of the resist R from the liquid dropping device 87 drop on the film to be processed Ox. Then, the mounting table 82 is moved to position to be processed location of the film to be processed Ox below the replica template 10.

Figure 5B:
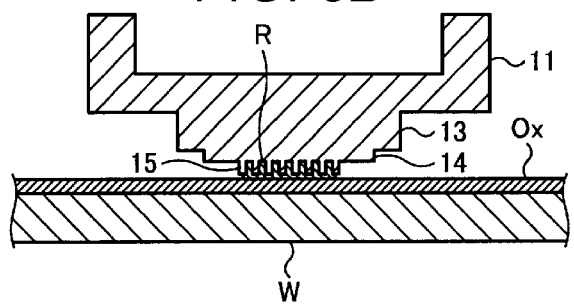
Figure 5C:
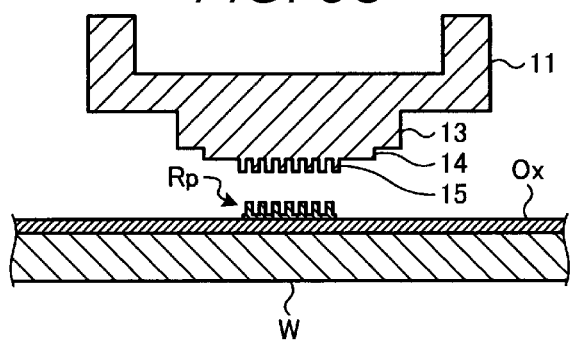

Next, as shown in FIGS. 5B and 5C, the resist R on the replica template 10 is imprinted and a resist pattern Rp to which the fine pattern 15 is transferred is formed under the condition that the resist R and a surface of the fine pattern 15 side of the replica template 10 face each other.

That is, as shown in FIG. 5B, while moving the template stage 81 downward and aligning with the alignment sensor 86, the fine pattern 15 of the replica template 10 is pressed against the resist R. At this time, since the fine pattern 15 is formed on the mesa portions 13 and 14, for example, even if the replica template 10 is in a tilted state, it is possible to prevent contact of the replica template with the wafer W. In addition, the mesa portion 14 among the mesa portions 13 and 14 comes into contact with the resist R, and controls a range and a thickness in which the resist R is spread. Subsequently, in a state where the replica template 10 is pressed into the resist, light is irradiated from the light source 89 of the imprint device 1 to the resist R, and the resist R is cured.

In addition, as shown in FIG. 5C, the replica template 10 is then released. With this, the resist pattern Rp to which the fine pattern 15 is transferred is formed on the film to be processed Ox of the wafer W.

Figure 5D:
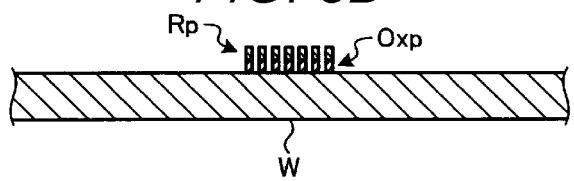

Next, as shown in FIG. 5D, the film to be processed Ox is processed using the resist pattern Rp to which the fine pattern 15 was transferred as an etching mask. With this, a film pattern Oxp is formed of the filmed to be processed Ox.

Figure 5E:
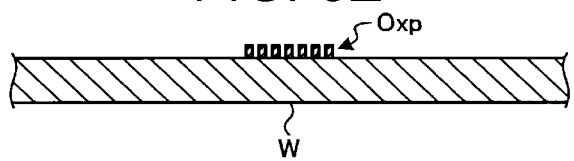

Next, as shown in FIG. 5E, the resist pattern Rp is removed by asking or the like such that the film pattern Oxp formed on the wafer W is obtained.

From then on, by repeating the above process and forming a plurality of the film patterns on the wafer W, the semiconductor device is manufactured.

Manufacturing Process of Master Template

Next, by using FIG. 6A to FIG. 7E, an example of the manufacturing process of the master template 20 will be described. Hereinafter, as an example of the manufacturing process of the master template 20, two examples of an example in which the recess portion 24 is formed first and an example in which the fine pattern 25 is formed first will be described.

Manufacturing Example 1

FIGS. 6A to 6F are diagrams illustrating the manufacturing process of the master template 20 according to the embodiment. FIGS. 6A to 6F illustrate an example in which the recess portion 24 is formed first.

Figure 6A:
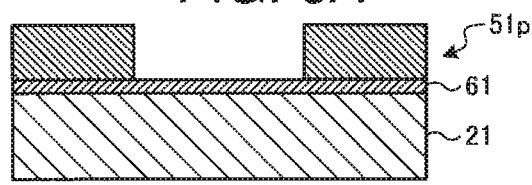
FIGS. 6A to 6F are diagrams illustrating an example of a procedure of the manufacturing process of the master template according to the embodiment.

As shown in FIG. 6A, a flat plate shaped substrate 21 is prepared. A Cr film 61 and a resist film are then formed on the substrate 21. Drawing by an electron beam writer is performed on the resist film, and a resist pattern 51$p$ in which a desired formation region of the recess portion 24 is located is formed as an opening in the resist.

Figure 6B:
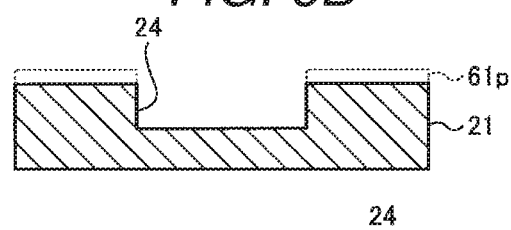

Next, as shown in FIG. 6B, the Cr film 61 is etched using the resist pattern 51$p$ as a mask, and a Cr pattern 61$p$ in which the desired formation region of the recess portion 24 is removed is formed. At this time, the resist pattern 51$p$ is removed. Thereafter, the substrate 21 is etched using the Cr pattern 61$p$ as a mask, and the recess portion 24 is formed in the substrate 21. At this time, the Cr pattern 61$p$ is removed.

Figure 6C:
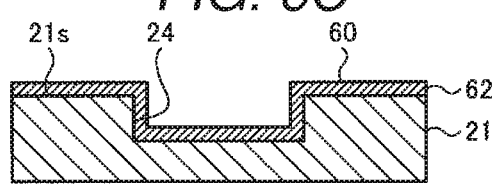

Next, as shown in FIG. 6C, a Cr film 62 is formed on the main surface 21$s$ and the walls and base of the recess portion 24 of the substrate 21.

Figure 6D:
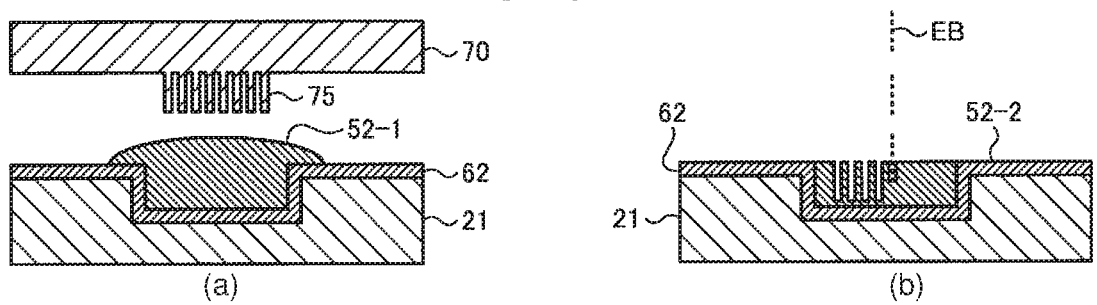

Next, as shown in FIG. 6D (part a, page left), a resist 52-1 is dropped into the recess portion 24 of the substrate 21. Thereafter, a template 70 in which a fine pattern 75 is formed, is used to imprint the fine pattern 75 in the resist 52-1, and the fine pattern 75 is transferred to the resist 52-1.

In addition, as shown in FIG. 6D (part b, page right), the fine pattern may be formed on a resist film 52-2 within the recess portion 24 by drawing using an electron beam EB writer.

Figure 6E:
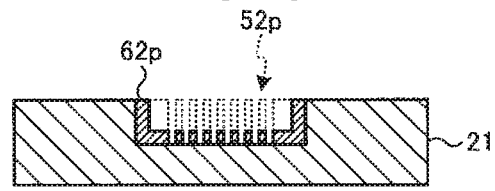

Next, as shown in FIG. 6E, the Cr film 62 is etched using the resist pattern 52$p$ to which the fine pattern was transferred as a mask, and a Cr pattern 62$p$ to which the fine pattern is transferred is formed. At this time, the resist pattern 52$p$ within the recess portion 24 and on the Cr film on the main surface 21$s$ of the substrate 21 is removed.

Figure 6F:
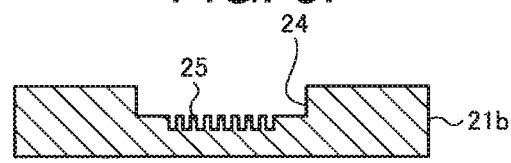

Next, as shown in FIG. 6F, the bottom of the recess portion 24 of the substrate 21 is etched using the Cr pattern 62$p$ as a mask, and the fine pattern 25 further extending inwardly of the bottom of the recess portion 24 in a depth direction of the substrate 21 is formed. At this time, the Cr pattern 62$p$ within the recess portion 24 is removed.

As described above, a master template 20 is manufactured.

Manufacturing Example 2

FIGS. 7A to 7E are diagrams illustrating another example of a procedure of the manufacturing process of the master template 20 according to the embodiment. FIGS. 7A to 7E illustrate an example in which the fine pattern 25 is formed first.

Figure 7A:
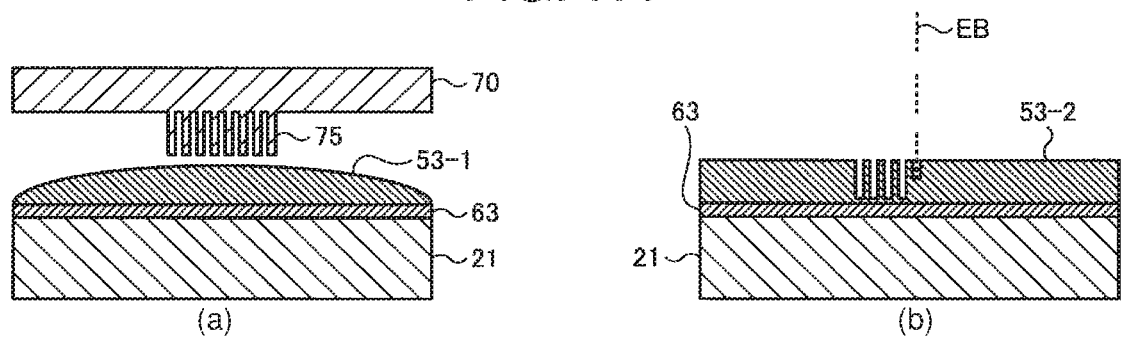
FIGS. 7A to 7E are diagrams illustrating another example of the procedure of the manufacturing process of the master template according to the embodiment.

As shown in FIG. 7A (part a, page left), the flat plate shaped substrate 21 is prepared. A Cr film 63 is formed on the substrate 21. In addition, the resist 53-1 is dropped on the Cr film 63 of the substrate 21. Thereafter, the template 70 on which the fine pattern 75 is formed is pushed into the resist 53-1 and the fine pattern 75 is transferred to the resist 53-1.

In addition, as shown in FIG. 7A (part b, page right), the fine pattern may be formed on a resist film 53-2 of the substrate 21 by drawing using an electron beam EB writer.

Figure 7B:
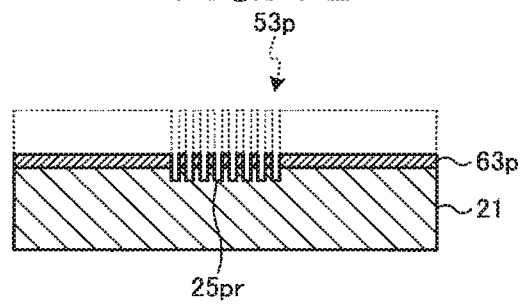

Next, as shown in FIG. 7B, the Cr film 63 is etched using the resist pattern 53$p$ to which the fine pattern was transferred as a mask, and a Cr pattern 63$p$ into which the fine pattern is transferred is formed. At this time, the resist pattern 53$p$ is removed. Furthermore, the substrate 21 is etched using the Cr pattern 63$p$ as a mask and a fine pattern 25$pr$ is formed in the substrate 21.

Figure 7C:
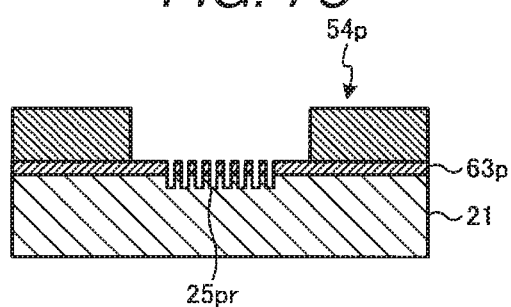

Next, as shown in FIG. 7C, the resist film is formed on the substrate 21. By performing the draw with the electron beam on the resist film, a resist pattern 54$p$ in which the desired formation region of the recess portion 24 is opened or removed is formed.

Figure 7D:
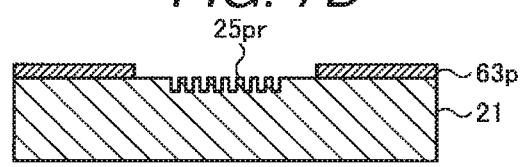

Next, as shown in FIG. 7D, the Cr pattern 63$p$ is further etched using the resist pattern 54$p$ as a mask, and the Cr pattern 63$p$ in which the scheduled formation region of the recess portion 24 is opened or removed is formed. At this time, the resist pattern 54$p$ is removed.

Figure 7E:

Next, as shown in FIG. 7E, the substrate 21 is etched using the Cr pattern 63$p$ as a mask and the recess portion 24 is formed on the substrate 21. At this time, the fine pattern 25$pr$ formed on the substrate 21 is further recessed into the substrate 21 and a fine pattern 25 further extending in the depth direction from the bottom of the recess portion 24 is formed. By this process, the Cr pattern 63$p$ of the main surface 21$s$ of the substrate 21 is also removed.

As described above, a master template 20 is manufactured.

Comparison Example

Next, with reference to FIGS. 8A to 8H, an example of a manufacturing process of a replica template of a comparison example will be described. FIGS. 8A to 8H are diagrams illustrating an example of procedures of a manufacturing process of a replica template according to a comparison example.

Figure 8A:
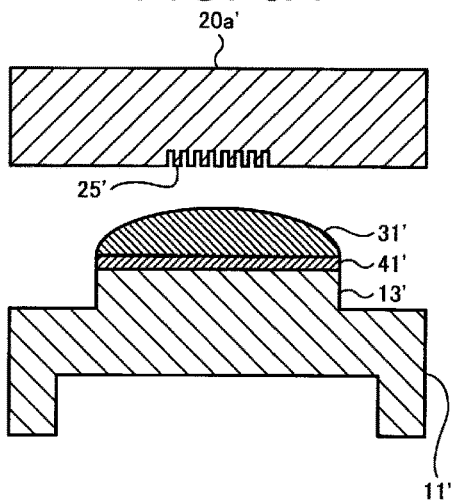
FIGS. 8A to 8H are diagrams illustrating the procedure of a manufacturing process of a replica template according to a comparison example.

As shown in FIG. 8A, a Cr film 41' is formed on a mesa portion 13' of a substrate 11' including a mesa portion 13' and the resist 31' is dropped thereon. A master template 20$a$' including a fine pattern 25' transfers the fine pattern 25' by imprinting it into the resist 31'. With this, as shown in FIG. 8B, a resist pattern 31$p$' is formed.

Figure 8E:
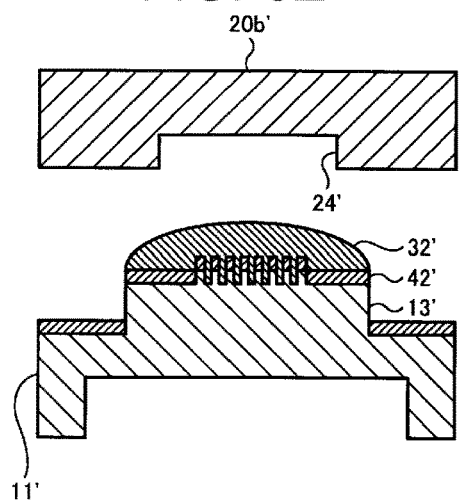
Figure 8B:
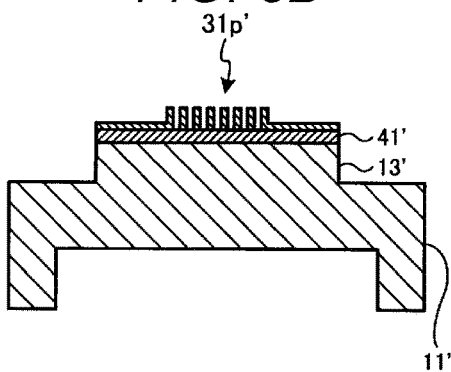
Figure 8F:
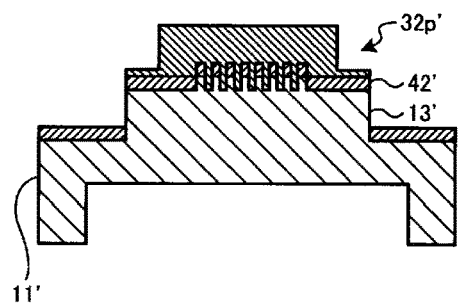
Figure 8C:
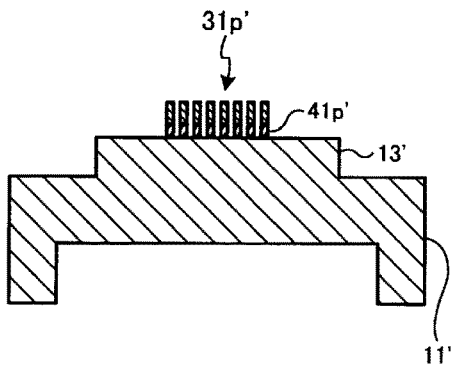

Next, as shown in FIG. 8C, the Cr film 40' is etched using the resist pattern 31$p$' as a mask and a Cr pattern 41$p$' is formed on mesa 13'.

Figure 8G:
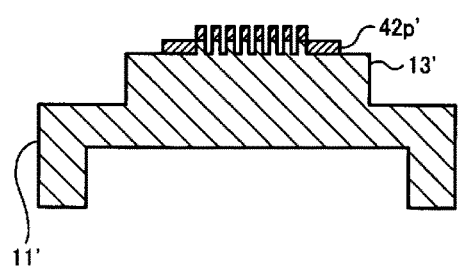
Figure 8D:
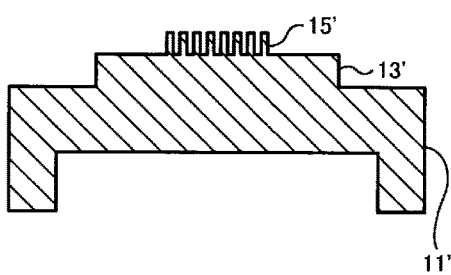

Next, as shown in FIG. 8D, the substrate 11' is etched using the Cr pattern 41$p$' as a mask and the fine pattern 15' is formed in the mesa 13' portion of the substrate 11'.

Next, as shown in FIG. 8E, a second Cr film 42' is formed on the entity of the main surface the substrate 11'. In addition, a second resist 32' is dropped on the mesa portion 13' of the substrate 11'. The recess portion 24' pattern is transferred thereto by pressing a master template 20$b$' including the recess portion 24' against the resist 32'. With this, as shown in FIG. 8F, a resist pattern 32$p$' is formed.

Next, as shown in FIG. 8G, the Cr film 42' is etched using the resist pattern 32p' as a mask and a Cr pattern 42p' to which the recess portion 24' is transferred is formed.

Figure 8H:
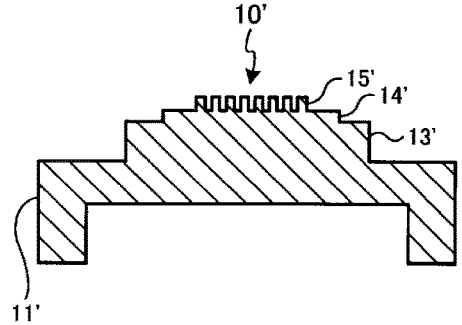

Next, as shown in FIG. 8H, the substrate 11' is etched using the Cr pattern 42p' as a mask and the mesa portion 14' is formed.

As described above, the replica template 10' including the mesa portions 13' and 14' and the fine pattern 15' is manufactured.

In a manufacturing process of a comparison example, by using the master templates 20a' and 20b' of two types, the fine pattern 15' and the mesa portion 14' have to be formed in separate processes. Therefore, additional cost and time are required to manufacture the replica template 10'.

In the manufacturing process of the replica template 10 of the embodiment, by using the master template 20 of one type including the recess portion 24 and the fine pattern 25, it is possible to collectively form the fine pattern 15 and the mesa portion 14. With this, it is possible to reduce the cost and time to manufacture the replica template 10 of the embodiment.

In addition, in the manufacturing process of the replica template 10 of the embodiment, the fine pattern 15 and the mesa portion 14 are collectively formed. Therefore, for example, when a plurality of the replica templates 10 are manufactured, it is possible to reduce variation in a position of the fine pattern 15 with respect to the mesa portion 14 between the replica templates 10 because their alignment is set by the pattern of the master template 20. As described above, the mesa portion 14 in contact with the resist R on the wafer W controls the range and the thickness in which the resist R is spread. When a position of the fine pattern 15 is fixed and constant with respect to the mesa portion 14 from replica template 10 to replica template 10, it is possible to reduce the variation of the range and the thickness in which the resist R is spread on the layer being patterned using the replica template 10. In addition, when the range in which the resist R is spread is constant, variation in a critical dimension (CD) of the outermost circumference pattern of the resist pattern Rp can also be reduced. With this, it is easy to reduce the variations in the remaining film thickness of the resist pattern Rp and the CD, and to optimize an imprint process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a replica template, the method comprising:
    forming a first mask pattern in a resist film on a patterning surface of a substrate by an imprint process, the patterning surface being on an upper surface of a first protruding portion of the substrate, the first protruding portion protruding from a first surface of the substrate, the first mask pattern on the upper surface of the first protruding portion comprising:
        a convex portion having a width less than a width of the patterning surface and a first thickness,
        a residual layer portion on the patterning surface adjacent to and surrounding the convex portion, the residual portion having a second thickness less than the first thickness, and
        a predetermined pattern on an upper surface of the convex portion;
    removing a portion of the first protruding portion corresponding in position to the residual layer portion by using the first mask pattern as an etch mask to form a second protruding portion directly adjacent to the first protruding portion, the second protruding portion having a height from the first surface different from a height of the first protruding portion from the first surface; and
    transferring a pattern to the substrate by etching the pattern into the patterning surface, the pattern being in a position on the patterning surface corresponding to the convex portion of the first mask pattern.

2. The method of claim 1, wherein
    the first mask pattern is formed by imprinting a resist disposed on the patterning surface of the substrate using a master template.

3. The method of claim 1, further comprising: forming a hardmask layer over the patterning surface before the forming of the first mask pattern.

4. The method of claim 2, wherein a pattern corresponding to the pattern transferred to the substrate by etching is formed in the hardmask layer.

5. The method of claim 3, wherein a portion of the hardmask layer underlying the residual layer portion of the first mask pattern is removed in a etch process prior to the removing of the portion of the first protruding portion correspond in position to the residual layer portion.

6. The method of claim 1, wherein the second protruding portion surrounds the first protruding portion.

7. The method of claim 1, wherein the height of the second protruding portion is further different from a height of the predetermined pattern from the first surface.

8. A method of manufacturing a semiconductor device comprising:
    manufacturing an imprint template by:
        forming a first mask pattern in a resist film on a patterning surface of an imprint template substrate by an imprint process, the patterning surface being on an upper surface of a first protruding portion of the imprint template substrate, the first protruding portion protruding from a first surface of the imprint template substrate, the first mask pattern on the upper surface of the first protruding portion comprising:
            a convex portion having a width less than a width of the first protruding portion and a first thickness,
            a residual layer portion on the patterning surface adjacent to and surrounding the convex portion, the residual portion having a second thickness less than the first thickness, and
            a predetermined pattern on an upper surface of the convex portion;
        removing a portion of the first protruding portion corresponding in position to the residual layer portion by using the first mask pattern as an etch mask to form a second protruding portion directly adjacent to the first protruding portion, the second protruding portion having a height from the first surface different from a height of the first protruding portion from the first surface, and transferring a pattern to the imprint template substrate by etching the pattern into the patterning surface, the pattern being in a position on the patterning surface corresponding to the convex portion of the first mask pattern;

forming a film on a semiconductor substrate;

placing a mask precursor material on the film;

placing the manufactured imprint template in contact with the mask precursor material to form a pattern in the mask precursor material; and processing the film using the pattern formed in the mask precursor material as a pattern transfer mask.

9. The method of claim 8, wherein the first mask pattern is formed by imprinting a resist disposed on the patterning surface of the imprint template substrate using a master template.

10. The method of claim 8, wherein, manufacturing the imprint template further comprises: forming a hardmask layer over the patterning surface before forming the first mask pattern.

11. The method of claim 10, wherein a pattern corresponding to the pattern transferred to the imprint template substrate by etching is formed in the hardmask layer.

12. The method of claim 11, wherein a portion of the hardmask layer underlying the residual layer portion of the first mask pattern is removed in a etch process prior to the removing of the portion of the first protruding portion correspond in position to the residual layer portion.

13. The method of claim 8, wherein the second protruding portion surrounds the first protruding portion.

14. The method of claim 8, wherein the height of the second protruding portion is further different from a height of the predetermined pattern from the first surface.

* * * * *